United States Patent
Tsuge

(10) Patent No.: US 11,777,701 B2
(45) Date of Patent: Oct. 3, 2023

(54) PHASE SYNCHRONIZATION CIRCUIT, TRANSMISSION AND RECEPTION CIRCUIT, AND INTEGRATED CIRCUIT

(71) Applicant: SOCIONEXT INC., Kanagawa (JP)

(72) Inventor: Masatoshi Tsuge, Yokohama (JP)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 17/142,590

(22) Filed: Jan. 6, 2021

(65) Prior Publication Data
US 2021/0126766 A1 Apr. 29, 2021

Related U.S. Application Data

(63) Continuation of application No. PCT/JP2018/025983, filed on Jul. 10, 2018.

(51) Int. Cl.
*H04L 7/00* (2006.01)
*H04L 7/033* (2006.01)

(52) U.S. Cl.
CPC ............ *H04L 7/0037* (2013.01); *H04L 7/033* (2013.01)

(58) Field of Classification Search
CPC ................. H04L 7/033; H04L 7/0037
See application file for complete search history.

(56) References Cited

U.S. PATENT DOCUMENTS

| | | | | |
|---|---|---|---|---|
| 3,271,688 A * | 9/1966 | Gschwind | ............... | H04L 7/033 331/25 |
| 3,293,547 A * | 12/1966 | Weissker | ................ | H04L 7/033 324/621 |
| 4,206,414 A * | 6/1980 | Chapman | .............. | H03L 7/0992 324/76.83 |
| 4,912,706 A * | 3/1990 | Eisenberg | .......... | H04Q 11/0001 398/55 |
| 6,300,807 B1 * | 10/2001 | Miyazaki | .............. | H04L 7/0037 327/158 |
| 6,489,824 B2 * | 12/2002 | Miyazaki | .............. | H04L 7/0008 327/158 |

(Continued)

FOREIGN PATENT DOCUMENTS

| | | | | |
|---|---|---|---|---|
| AU | 2002367071 A1 * | 7/2003 | ............. | H03L 7/087 |
| CA | 2441173 C * | 10/2012 | ........... | G02F 1/3515 |

(Continued)

OTHER PUBLICATIONS

JP2016025548, Description, JPO Translated, retrieved Mar. 16, 20222 using Global Dossier—USPTO (Year: 2016).*

(Continued)

*Primary Examiner* — Berhanu Tadese
(74) *Attorney, Agent, or Firm* — McDermott Will & Emery LLP

(57) ABSTRACT

A phase synchronization circuit which includes a first delay circuit for adjusting a first delay amount, delaying a first reference clock signal by the first delay amount, and outputting a first delayed reference clock signal. The phase synchronization circuit further includes a first clock control circuit that compares phases of the first delayed reference clock signal and a first output clock signal and generates a first clock control signal based on a result of the comparison;

(Continued)

US 11,777,701 B2

Page 2 a first clock signal generation circuit that generates the first output clock signal based on the first clock control signal; and a first monitoring circuit that monitors jitter in the first output clock signal and adjusts the first delay amount based on a result of monitoring the jitter in the first output clock signal.

15 Claims, 8 Drawing Sheets

(56) References Cited

U.S. PATENT DOCUMENTS

| | | | | |
|---|---|---|---|---|
| 6,912,260 | B2 * | 6/2005 | Young | H04B 7/2675 370/510 |
| 7,057,419 | B2 * | 6/2006 | Takeo | H03L 7/087 327/40 |
| 7,210,052 | B2 * | 4/2007 | Lee | H04L 7/0012 713/400 |
| 7,368,954 | B2 * | 5/2008 | Otomo | H03L 7/091 327/156 |
| 7,545,888 | B2 * | 6/2009 | Zhu | H04L 25/03057 375/326 |
| 7,599,433 | B2 * | 10/2009 | Zhu | H04L 25/03057 375/233 |
| 7,653,126 | B2 * | 1/2010 | Yang | H04L 25/03057 375/232 |
| 7,705,643 | B2 * | 4/2010 | Truppel | H04L 7/041 327/158 |
| 7,822,112 | B2 * | 10/2010 | Yang | H04L 25/03057 375/232 |
| 7,885,325 | B2 * | 2/2011 | Yang | H04L 25/03057 375/233 |
| 7,973,579 | B2 * | 7/2011 | Truppel | H03L 7/0891 327/158 |
| 7,995,648 | B2 * | 8/2011 | Xia | H04L 25/03057 375/348 |
| 8,126,083 | B2 * | 2/2012 | Yang | H04L 25/03057 370/208 |
| 8,253,454 | B2 | 8/2012 | Lin | |
| 8,483,317 | B2 * | 7/2013 | Zhu | H04L 25/03057 375/350 |
| 8,611,408 | B2 * | 12/2013 | Xia | H04L 25/03057 375/376 |
| 9,197,397 | B1 * | 11/2015 | Ono | H04L 7/0045 |
| 9,219,626 | B2 * | 12/2015 | Yamaguchi | H04L 7/0037 |
| 9,473,172 | B2 * | 10/2016 | Chieco | H04J 3/0682 |
| 9,557,766 | B1 * | 1/2017 | Magee | H04L 7/0041 |
| 9,859,901 | B1 | 1/2018 | Chu et al. | |
| 10,355,700 | B2 * | 7/2019 | Lim | H03L 7/0805 |
| 2002/0059536 | A1 * | 5/2002 | Saeki | G06F 7/68 713/500 |
| 2002/0177459 | A1 * | 11/2002 | Young | H03L 7/085 455/87 |
| 2003/0007222 | A1 * | 1/2003 | Kwasaki | H03L 7/197 398/202 |
| 2003/0102928 | A1 * | 6/2003 | d'Haene | H04L 7/033 331/172 |
| 2003/0103591 | A1 * | 6/2003 | Noguchi | H03B 5/1231 375/376 |
| 2004/0202270 | A1 * | 10/2004 | Lentine | H03L 7/087 375/376 |
| 2005/0212565 | A1 * | 9/2005 | Bogdan | H03L 7/07 327/105 |
| 2009/0016382 | A1 * | 1/2009 | Beaucage | H04L 5/22 370/503 |
| 2010/0303143 | A1 | 12/2010 | Takeda | |
| 2011/0234277 | A1 | 9/2011 | Stephens et al. | |
| 2015/0222377 | A1 * | 8/2015 | Chieco | H04J 3/0685 370/503 |
| 2016/0173266 | A1 * | 6/2016 | Yang | H04L 7/033 375/354 |
| 2017/0041131 | A1 * | 2/2017 | Yang | H04L 7/033 |
| 2019/0158100 | A1 * | 5/2019 | Lim | H03L 7/0805 |
| 2021/0126766 | A1 * | 4/2021 | Tsuge | H04L 7/033 |

FOREIGN PATENT DOCUMENTS

| | | | | |
|---|---|---|---|---|
| CN | 1114809 | A * | 1/1996 | H03K 5/133 |
| CN | 1128520 | C * | 11/2003 | H03K 5/133 |
| CN | 1218489 | C * | 9/2005 | H03L 7/00 |
| CN | 1249551 | C * | 4/2006 | G06F 1/08 |
| CN | 1842070 | A * | 10/2006 | H04L 7/0029 |
| CN | 100407824 | C * | 7/2008 | |
| CN | 1842070 | B * | 4/2010 | H04L 7/0029 |
| CN | 102457285 | A * | 5/2012 | H04L 25/14 |
| CN | 104283665 | A * | 1/2015 | G09G 5/008 |
| CN | 102457285 | B * | 8/2016 | H04L 25/14 |
| CN | 106253902 | A * | 12/2016 | H03M 1/1009 |
| CN | 104283665 | B * | 12/2018 | G09G 5/008 |
| CN | 107623520 | B * | 12/2020 | G06F 13/4278 |
| CN | 112400279 | A * | 2/2021 | H04L 7/0037 |
| EP | 1601103 | A1 * | 11/2005 | H03L 7/0893 |
| EP | 1601130 | A2 * | 11/2005 | G06F 1/10 |
| EP | 1633049 | A2 * | 3/2006 | G06F 1/10 |
| EP | 1633049 | B1 * | 11/2008 | G06F 1/10 |
| EP | 1601130 | B1 * | 12/2008 | G06F 1/10 |
| EP | 1601103 | B1 * | 2/2012 | H03L 7/0893 |
| EP | 1188285 | B1 * | 6/2012 | G10L 25/90 |
| GB | 2174565 | A * | 11/1986 | H04L 27/2273 |
| GB | 2520650 | A * | 5/2015 | H04B 10/61 |
| JP | 63184965 | A * | 7/1988 | |
| JP | 06303182 | A * | 10/1994 | |
| JP | H10-032489 | A | 2/1998 | |
| JP | 2993559 | B2 * | 12/1999 | H03L 7/087 |
| JP | 2000059209 | A * | 2/2000 | H03K 5/133 |
| JP | 2003198363 | A * | 7/2003 | H03L 7/087 |
| JP | 2003-229762 | A | 8/2003 | |
| JP | 2004085236 | A * | 3/2004 | |
| JP | 2004088476 | A * | 3/2004 | H03L 7/07 |
| JP | 2004-153332 | A | 5/2004 | |
| JP | 2004187205 | A * | 7/2004 | H04J 14/08 |
| JP | 3559781 | B2 * | 9/2004 | H03L 7/0893 |
| JP | 3739095 | B2 * | 1/2006 | H04L 7/0008 |
| JP | 3769940 | B2 * | 4/2006 | H03K 5/133 |
| JP | 2010-278720 | A | 12/2010 | |
| JP | 2011-171895 | A | 9/2011 | |
| JP | 4828730 | B2 * | 11/2011 | H03L 7/091 |
| JP | 2013-528011 | A | 7/2013 | |
| JP | 2016025548 | * | 2/2016 | H03L 7/081 |
| JP | 2016025548 | A * | 2/2016 | |
| WO | WO-9704540 | A1 * | 2/1997 | H04H 20/67 |
| WO | WO-0141351 | A1 * | 6/2001 | H03L 7/08 |
| WO | WO-0180238 | A1 * | 10/2001 | G11B 20/10009 |
| WO | WO-03061131 | A1 * | 7/2003 | H03L 7/087 |
| WO | WO-2004054165 | A1 * | 6/2004 | H03D 13/004 |
| WO | WO-2004079907 | A1 * | 9/2004 | H03L 7/0893 |
| WO | WO-2005099399 | A2 * | 10/2005 | H04L 25/03057 |
| WO | WO-2005099407 | A2 * | 10/2005 | H03H 7/30 |
| WO | WO-2005101652 | A1 * | 10/2005 | H04L 25/03057 |
| WO | WO-2005101653 | A1 * | 10/2005 | H04L 25/03057 |
| WO | WO-2005101654 | A1 * | 10/2005 | H04L 25/03057 |
| WO | WO-2005101655 | A1 * | 10/2005 | H04L 25/03057 |
| WO | WO-2005101656 | A1 * | 10/2005 | H04L 25/03057 |
| WO | WO-2005101777 | A1 * | 10/2005 | H04L 25/03057 |
| WO | WO-2005101778 | A1 * | 10/2005 | H04L 25/03057 |
| WO | WO-2009098989 | A1 * | 8/2009 | H04L 27/0014 |
| WO | WO-2009119599 | A1 * | 10/2009 | H03L 7/085 |
| WO | WO-2012091486 | A1 * | 7/2012 | G11C 29/023 |
| WO | WO-2017094310 | A1 * | 6/2017 | H03K 5/26 |
| WO | WO-2017199603 | A1 * | 11/2017 | H03L 7/095 |
| WO | WO-2020012550 | A1 * | 1/2020 | H04L 7/0037 |
| WO | WO-2020166645 | A1 * | 8/2020 | G06F 1/06 |
| WO | WO-2021166176 | A1 * | 8/2021 | H03K 3/023 |

OTHER PUBLICATIONS

JP2016025548, Drawings, JPO Translated, retrieved Mar. 16, 20222 using Global Dossier—USPTO (Year: 2016).*

(56) References Cited

OTHER PUBLICATIONS

WO2009119599 (WIPO Translated), Clock Synchronization System, Node, Clock Synchronization Method, and Program (Year: 2009).*

JP2016025548, (JPO Translated)—PLL circuit (Year: 2016).*

International Search Report and Written Opinion issued in International Patent Application No. PCT/JP2018/025983, dated Aug. 28, 2018; with English translation.

Notice of Reasons for Refusal dated May 10, 2022 issued in the corresponding Japanese Patent Application No. 2020-529872, with English translation.

* cited by examiner

US 11,777,701 B2

PHASE SYNCHRONIZATION CIRCUIT, TRANSMISSION AND RECEPTION CIRCUIT, AND INTEGRATED CIRCUIT

CROSS-REFERENCE TO RELATED APPLICATION

This application is a continuation application of International Application PCT/JP2018/025983 filed on Jul. 10, 2018 and designated the U.S., the entire contents of which are incorporated herein by reference.

FIELD

The embodiments discussed herein are directed to a phase synchronization circuit, a transmission and reception circuit, and an integrated circuit.

BACKGROUND

There has been known a clock generation circuit that uses a phase locked loop in which a frequency divider generates a feedback clock obtained by dividing the frequency of an output clock of a voltage controlled oscillator to a predetermined value (see Patent Document 1). A phase comparator detects a phase difference between the feedback clock and an input reference clock and generates a phase error signal intended for eliminating this phase difference to control the output clock of the voltage controlled oscillator. In the case where the frequency variation of the input reference clock is larger than a predetermined range, an adjustment circuit adjusts the frequency variation within a predetermined range.

Further, there has been known a phase locked loop circuit that includes a phase comparator intended for generating a signal indicative of a phase difference between a signal presented to a first input of the phase comparator and a signal presented to a second input of the phase comparator (see Patent Document 2). A first delay element provides delay to the signal provided to the first input of the phase comparator. A second delay element provides delay to the signal provided to the second input of the phase comparator. The delay that is provided by at least one of the first delay element and the second delay element varies in accordance with an associated delay control value. A microcontroller is coupled to the first delay element and the second delay element to generate the associated delay control value. The phase locked loop circuit, the first delay element, the second delay element, and the microcontroller reside on the same semiconductor substrate.

Further, there has been known a phase lock loop including a phase-interpolation controller that generates a phase-interpolation control signal from an input clock (see Patent Document 3). A phase/frequency detector detects a phase difference between a second reference clock and a feedback clock to output a phase error signal representing the phase difference. A loop filter filters the phase error signal to generate a first control signal. A phase-interpolated oscillator generates an output clock under a phase interpolation by a first reference clock controlled by the phase-interpolation control signal and an oscillation condition controlled by the first control signal. A divide-by-N circuit (N being an integer) divides the output clock by N to generate the feedback clock. A variable delay module is coupled to the phase/frequency detector and generates the second reference clock by delaying the input clock by an amount controlled by a second control signal.

[Patent Document 1] Japanese Laid-open Patent Publication No. 2004-153332
[Patent Document 2] U.S. Pat. No. 9,859,901
[Patent Document 3] U.S. Pat. No. 8,253,454

The phase locked loop circuit generates an output clock signal. However, jitter sometimes occurs in the output clock signal. The jitter is variations (fluctuations) of high frequency that occur in the direction of the time axis of the output clock signal.

SUMMARY

A phase synchronization circuit includes: a first delay circuit that is capable of adjusting a first delay amount, delays a first reference clock signal by the first delay amount, and outputs a first delayed reference clock signal; a first clock control circuit that compares phases of the first delayed reference clock signal and a first output clock signal and generates a first clock control signal based on a result of the comparison; a first clock signal generation circuit that generates the first output clock signal based on the first clock control signal; and a first monitoring circuit that monitors jitter in the first output clock signal and adjusts the first delay amount based on a result of monitoring the jitter in the first output clock signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1:
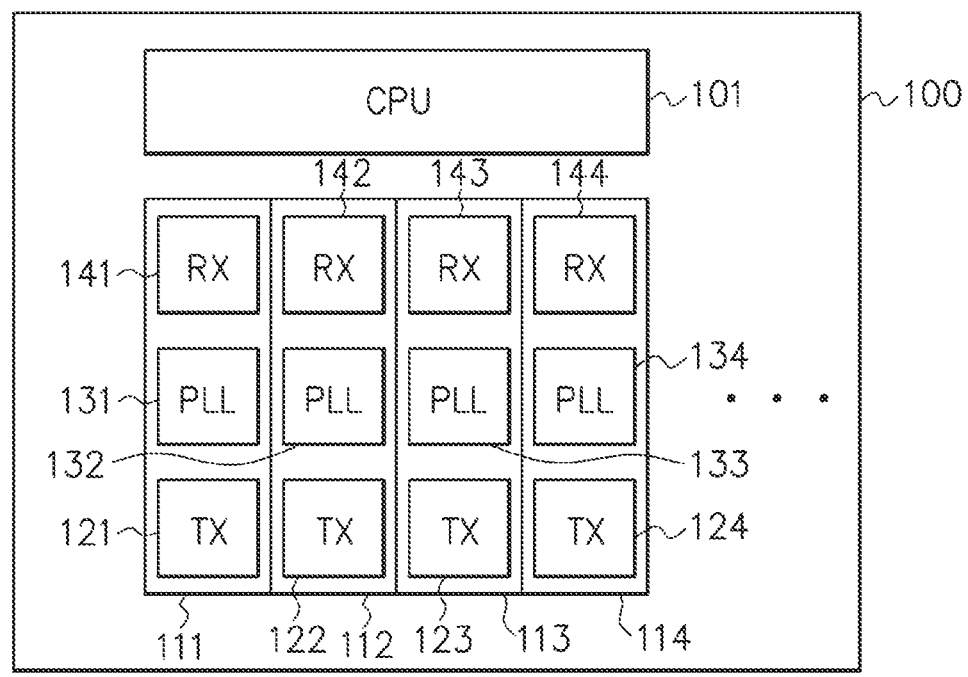
FIG. 1 is a diagram illustrating a configuration example of an integrated circuit according to a first embodiment.

FIG. 1 is a diagram illustrating a configuration example of an integrated circuit 100 according to a first embodiment.

The integrated circuit 100 includes a central processing unit (CPU) 101 and transmission and reception circuits 111 to 114 of a plurality of lanes.

The transmission and reception circuit 111 includes a transmission circuit (TX) 121, a phase locked loop (PLL) circuit 131, and a reception circuit (RX) 141. The phase locked loop circuit 131 is a phase synchronization circuit and generates an output clock signal. The transmission circuit 121 transmits transmission data based on the output clock signal generated by the phase locked loop circuit 131. The reception circuit 141 receives reception data based on the output clock signal generated by the phase locked loop circuit 131. The central processing unit 101 is an internal circuit and outputs the transmission data to the transmission circuit 121 and receives the reception data from the reception circuit 141. The transmission circuit 121 converts the transmission data received from the central processing unit 101 into serial transmission data from parallel transmission data and transmits the serial transmission data to a different integrated circuit in synchronization with the output clock signal generated by the phase locked loop circuit 131. The reception circuit 141 includes a clock data recovery (CDR) circuit and regenerates a clock signal and reception data based on a serial reception signal received from the mentioned different integrated circuit in synchronization with the output clock signal generated by the phase locked loop circuit 131. Then, the reception circuit 141 converts the reception data into parallel reception data from the serial reception data and outputs the parallel reception data to the central processing unit 101.

The transmission and reception circuit 112 includes a transmission circuit 122, a phase locked loop circuit 132, and a reception circuit 142. The phase locked loop circuit 132 is a phase synchronization circuit and generates an output clock signal. The transmission circuit 122 transmits transmission data based on the output clock signal generated by the phase locked loop circuit 132. The reception circuit 142 receives reception data based on the output clock signal generated by the phase locked loop circuit 132. The central processing unit 101 outputs the transmission data to the transmission circuit 122 and receives the reception data from the reception circuit 142. The transmission circuit 122 performs the same processing as the transmission circuit 121. The reception circuit 142 performs the same processing as the reception circuit 141.

The transmission and reception circuit 113 includes a transmission circuit 123, a phase locked loop circuit 133, and a reception circuit 143. The phase locked loop circuit 133 is a phase synchronization circuit and generates an output clock signal. The transmission circuit 123 transmits transmission data based on the output clock signal generated by the phase locked loop circuit 133. The reception circuit 143 receives reception data based on the output clock signal generated by the phase locked loop circuit 133. The central processing unit 101 outputs the transmission data to the transmission circuit 123 and receives the reception data from the reception circuit 143. The transmission circuit 123 performs the same processing as the transmission circuit 121. The reception circuit 143 performs the same processing as the reception circuit 141.

The transmission and reception circuit 114 includes a transmission circuit 124, a phase locked loop circuit 134, and a reception circuit 144. The phase locked loop circuit 134 is a phase synchronization circuit and generates an output clock signal. The transmission circuit 124 transmits transmission data based on the output clock signal generated by the phase locked loop circuit 134. The reception circuit 144 receives reception data based on the output clock signal generated by the phase locked loop circuit 134. The central processing unit 101 outputs the transmission data to the transmission circuit 124 and receives the reception data from the reception circuit 144. The transmission circuit 124 performs the same processing as the transmission circuit 121. The reception circuit 144 performs the same processing as the reception circuit 141.

The transmission and reception circuits 111 to 114 include the phase locked loop circuits 131 to 134 respectively, so that it is possible to make transmission and reception speeds different. However, a plurality of the phase locked loop circuits 131 to 134 are arranged in close proximity to one another, and thus interference of power supply noise is likely to occur.

Incidentally, five or more transmission and reception circuits 111 to 114, and the like may be provided. Further, the central processing unit 101 may be provided for each of the transmission and reception circuits 111 to 114.

Figure 2:
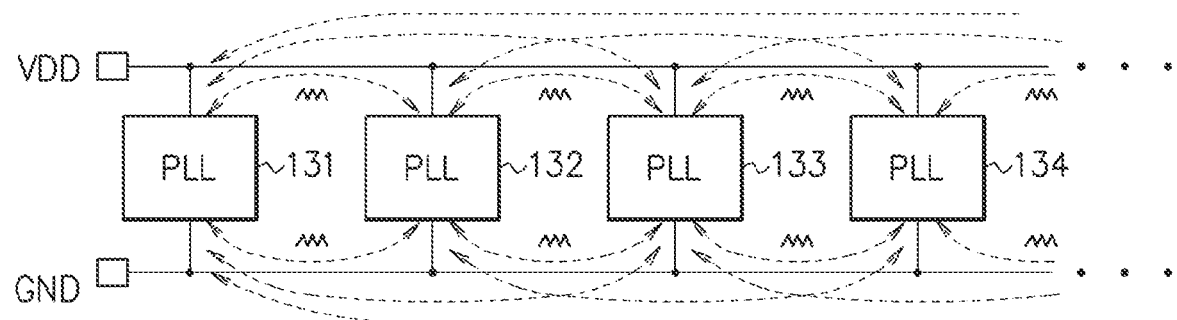
FIG. 2 is a view illustrating a power supply potential node and a ground potential node that are connected in common to a plurality of phase locked loop circuits.

FIG. 2 is a view illustrating a power supply potential node VDD and a ground potential node GND that are connected in common to a plurality of the phase locked loop circuits 131 to 134. There exist three kinds of power supply connection methods.

In the first power supply connection method, a plurality of the phase locked loop circuits 131 to 134 are connected to the common power supply potential node VDD and ground potential node GND in the integrated circuit 100.

In the second power supply connection method, power supply potential nodes and ground potential nodes of a plurality of the phase locked loop circuits 131 to 134 are separated in the integrated circuit 100. In this case, a plurality of the phase locked loop circuits 131 to 134 are connected to the common power supply potential node VDD and ground potential node GND by power supply connection of a package.

In the third power supply connection method, power supply potential nodes and ground potential nodes of a plurality of the phase locked loop circuits 131 to 134 are separated in the integrated circuit 100 and the package. In this case, a plurality of the phase locked loop circuits 131 to 134 are connected to the common power supply potential node VDD and ground potential node GND by power supply connection of a board.

In the case where a large number of the transmission and reception circuit 111 to 114 are provided in the integrated circuit 100, it is difficult to separate terminals (balls) of the package for each of all the transmission and reception circuits 111 to 114. In this case, the second power supply connection method is employed in many cases.

When a plurality of the phase locked loop circuits 131 to 134 operate simultaneously, power supply noises interfere with one another among a plurality of the phase locked loop circuits 131 to 134 via the power supply potential node VDD and the ground potential node GND.

Figure 3:
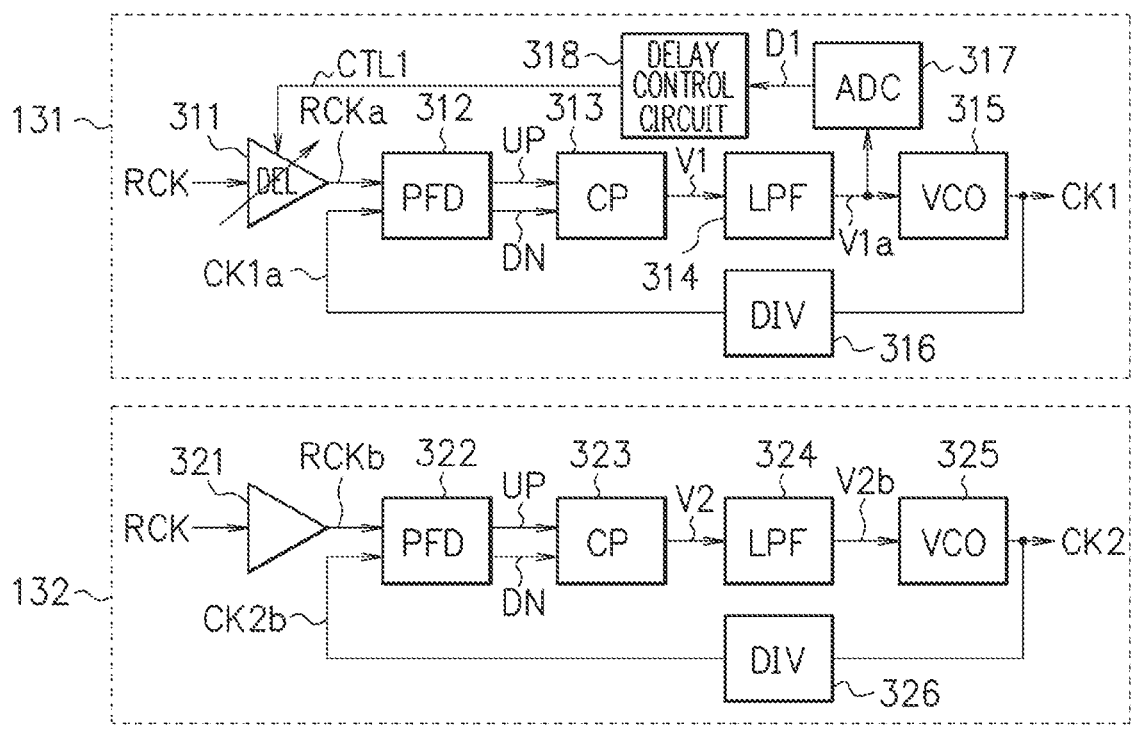
FIG. 3 is a diagram illustrating a configuration example of phase locked loop circuits.

FIG. 3 is a diagram illustrating a configuration example of the phase locked loop circuits 131 and 132 according to this embodiment.

The phase locked loop circuit 131 includes a delay circuit 311, a phase frequency detector (PFD) 312, a charge pump (CP) 313, a low-pass filter (LPF) 314, a voltage controlled oscillator (VCO) 315, a frequency divider (DIV) 316, an analog-digital converter (ADC) 317, and a delay control circuit 318, and generates an output clock signal CK1.

The delay circuit 311 is capable of adjusting a delay amount, delays a reference clock signal RCK by the delay amount, and outputs a delayed reference clock signal RCKa.

The reference clock signal RCK is, for example, 100 MHz. The frequency divider 316 divides the frequency of the output clock signal CK1 generated by the voltage controlled oscillator 315 and outputs a frequency-divided clock signal CK1a to the phase frequency detector 312. The phase frequency detector 312 compares phases and frequencies of the delayed reference clock signal RCKa and the clock signal CK1a and outputs an up signal UP or a down signal DN to the charge pump 313 based on a result of the comparison. When receiving the up signal UP, the charge pump 313 increases the voltage of a control signal V1, and when receiving the down signal DN, the charge pump 313 lowers the voltage of the control signal V1. The low-pass filter 314 low-pass filters the control signal V1 and outputs a low-pass filtered clock control signal V1a to the voltage controlled oscillator 315. The phase frequency detector 312, the charge pump 313, the low-pass filter 314, and the frequency divider 316 are one example of a clock control circuit that generates the clock control signal V1a. The voltage controlled oscillator 315 is a clock signal generation circuit and generates the output clock signal CK1 of a frequency based on a voltage of the clock control signal V1a. The output clock signal CK1 is, for example, several gigahertz. Incidentally, the analog-digital converter 317 and the delay control circuit 318 will be described later.

The phase locked loop circuit 132 includes a delay circuit 321, a phase frequency detector 322, a charge pump 323, a low-pass filter 324, a voltage controlled oscillator 325, and a frequency divider 326, and generates an output clock signal CK2.

The delay circuit 321 delays the reference clock signal RCK by a predetermined delay amount, and outputs a delayed reference clock signal RCKb. Incidentally, the delay circuit 321 may be deleted. The frequency divider 326 divides the frequency of the output clock signal CK2 generated by the voltage controlled oscillator 325 and outputs a frequency-divided clock signal CK2b to the phase frequency detector 322. The phase frequency detector 322 compares phases and frequencies of the delayed reference clock signal RCKb and the clock signal CK2b and outputs an up signal UP or a down signal DN to the charge pump 323 based on a result of the comparison. When receiving the up signal UP, the charge pump 323 increases the voltage of a control signal V2, and when receiving the down signal DN, the charge pump 323 lowers the voltage of the control signal V2. The low-pass filter 324 low-pass filters the control signal V2 and outputs a low-pass filtered clock control signal V2b to the voltage controlled oscillator 325. The phase frequency detector 322, the charge pump 323, the low-pass filter 324, and the frequency divider 326 are one example of a clock control circuit that generates the clock control signal V2b. The voltage controlled oscillator 325 is a clock signal generation circuit and generates the output clock signal CK2 of a frequency based on a voltage of the clock control signal V2b. Incidentally, the phase locked loop circuit 132 may generate the output clock signal CK2 by having a configuration different from that of the phase locked loop circuit 131.

When the phase locked loop circuits 131 and 132 operate simultaneously, power supply noises interfere with each other between the phase locked loop circuits 131 and 132 via the power supply potential node VDD and the ground potential node GND. As a result, jitter occurs in the output clock signal CK1 and the output clock signal CK2. The jitter is variations (fluctuations) of high frequency that occur in the direction of the time axis of the output clock signals CK1 and CK2.

The size of the jitter in the output clock signal CK1 depends on the power supply noise and the phase of the output clock signal CK1. Thus, changing the phase of the output clock signal CK1 to an appropriate phase makes it possible to reduce the jitter in the output clock signal CK1. The delay circuit 311 changes the phase of the delayed reference clock signal RCKa, and thereby, the phase locked loop circuit 131 changes the phase of the output clock signal CK1, resulting in that it is possible to reduce the jitter in the output clock signal CK1. The delay control circuit 318 adjusts the delay amount of the delay circuit 311 so as to make the jitter in the output clock signal CK1 minimum.

The size of the jitter in the output clock signal CK1 depends on the size of a variation amount of the clock control signal V1a. That is, as the variation amount of the clock control signal V1a is larger, the jitter in the output clock signal CK1 increases. Thus, the analog-digital converter 317 converts the clock control signal V1a into a digital clock control signal from an analog clock control signal and outputs a digital control signal D1 to the delay control circuit 318. The delay control circuit 318 adjusts the delay amount of the delay circuit 311 by a delay control signal CTL1 so as to make the variation amount of the control signal D1 minimum. This makes the delay control circuit 318 possible to adjust the delay amount of the delay circuit 311 by the delay control signal CTL1 so as to make the jitter in the output clock signal CK1 minimum.

Concretely, the delay control circuit 318 varies the delay amount of the delay circuit 311 from a minimum value to a maximum value, and detects the maximum value and the minimum value of the control signal D1 for each delay amount to detect the difference between the maximum value and the minimum value of the control signal D1 as a variation amount. Then, the delay control circuit 318 searches for the delay amount at which the variation amount of the control signal D1 is minimum among the minimum to maximum values of the delay amount of the delay circuit 311 and fixes the delay amount of the delay circuit 311. This makes it possible to minimize the jitter in the output clock signal CK1.

By varying the delay amount of the delay circuit 311, the phase of the delayed reference clock signal RCKa is changed and the phase of the power supply noise by the phase locked loop circuit 131 is changed. Thereby, the jitter in the output clock signal CK2 generated by the phase locked loop circuit 132 is also reduced.

As above, the analog-digital converter 317 and the delay control circuit 318 are one example of a monitoring circuit and monitor the jitter in the output clock signal CK1 and adjust the delay amount of the delay circuit 311 based on a result of monitoring the jitter in the output clock signal CK1.

Figure 4:
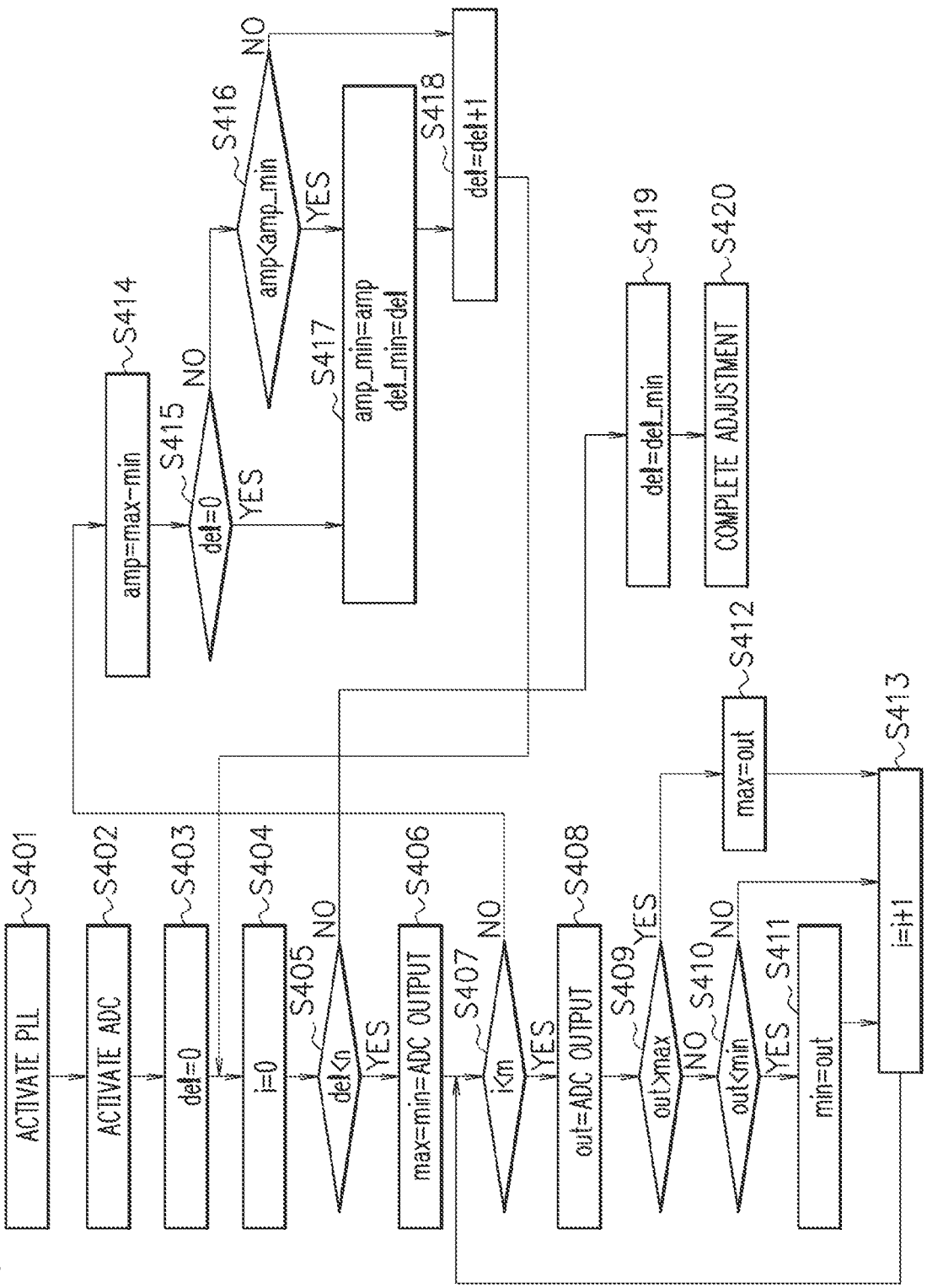
FIG. 4 is a flowchart illustrating a method of controlling the integrated circuit.

FIG. 4 is a flowchart illustrating a method of controlling the integrated circuit 100. At Step S401, the central processing unit 101 activates the phase locked loop circuit 131 and the phase locked loop circuit 132. At Step S402, the central processing unit 101 activates the analog-digital converter 317 in the phase locked loop circuit 131.

At Step S403, the delay control circuit 318 assigns zero (a minimum value) to a delay amount del of the delay circuit 311. The delay amount del may be a delay code. At Step S404, the delay control circuit 318 assigns zero to a variable i.

At Step S405, the delay control circuit 318 determines whether or not the delay amount del is smaller than a maximum delay amount n. In the case where the delay amount del is smaller than the maximum delay amount n, the delay control circuit 318 proceeds to Step S406, and in the case where the delay amount del is larger than the maximum delay amount n, the delay control circuit 318 proceeds to Step S419.

At Step S406, the delay control circuit 318 assigns the value of the control signal D1 output from the analog-digital converter 317 to a maximum value max and a minimum value min.

At Step S407, the delay control circuit 318 determines whether or not the variable i is smaller than the number of times of detection m. The number of times of detection m is the number of times for which the delay control circuit 318 detects the control signal D1. In the case where the variable i is smaller than the number of times of detection m, the delay control circuit 318 proceeds to Step S408, and in the case where the variable i is larger than the number of times of detection m, the delay control circuit 318 proceeds to Step S414.

At Step S408, the delay control circuit 318 assigns the value of the control signal D1 output from the analog-digital converter 317 to a variable out. At Step S409, the delay control circuit 318 determines whether or not the variable out is larger than the maximum value max. In the case where the variable out is larger than the maximum value max, the delay control circuit 318 proceeds to Step S412, and in the case where the variable out is smaller than the maximum value max, the delay control circuit 318 proceeds to Step S410.

At Step S412, the delay control circuit 318 assigns the variable out to the maximum value max and proceeds to Step S413.

At Step S410, the delay control circuit 318 determines whether or not the variable out is smaller than the minimum value min. In the case where the variable out is smaller than the minimum value min, the delay control circuit 318 proceeds to Step S411, and in the case where the variable out is larger than the minimum value min, the delay control circuit 318 proceeds to Step S413.

At Step S411, the delay control circuit 318 assigns the variable out to the minimum value min and proceeds to Step S413.

At Step S413, the delay control circuit 318 increments the variable i and returns to Step S407. The above-described processing is performed repeatedly for m times, thereby making it possible to detect the maximum value max and the minimum value min of the control signal D1.

At Step S414, the delay control circuit 318 assigns the value obtained by subtracting the minimum value min from the maximum value max to a variation amount amp.

At Step S415, the delay control circuit 318 determines whether or not the delay amount del is zero. In the case where the delay amount del is zero, the delay control circuit 318 proceeds to Step S417, and in the case where the delay amount del is not zero, the delay control circuit 318 proceeds to Step S416.

At Step S417, the delay control circuit 318 assigns the variation amount amp to a minimum variation amount amp_min and assigns the delay amount del to a minimum variation delay amount del_min and proceeds to Step S418.

At Step S416, the delay control circuit 318 determines whether or not the variation amount amp is smaller than the minimum variation amount amp_min. In the case where the variation amount amp is smaller than the minimum variation amount amp_min, the delay control circuit 318 proceeds to Step S417, and in the case where the variation amount amp is larger than the minimum variation amount amp_min, the delay control circuit 318 proceeds to Step S418.

At Step S418, the delay control circuit 318 increments the delay amount del and returns to Step S404. The above-described processing is performed repeatedly with the minimum value 0 to the maximum value n of the delay amount del. The minimum variation amount amp out of the variation amounts amp obtained when the delay amount del is varied from the minimum value 0 to the maximum value n is assigned to the minimum variation amount amp_min. The delay amount del at which the minimum variation amount amp_min is obtained, out of the minimum value 0 to the maximum value n of the delay amount del is assigned to the minimum variation delay amount del_min.

At Step S419, the delay control circuit 318 assigns the minimum variation delay amount del_min to the delay amount del. At Step S420, the delay control circuit 318 fixes the delay amount del of the delay circuit 311 and completes the adjustment of the delay amount del. Thereafter, the integrated circuit 100 performs a normal operation.

Second Embodiment

Figure 5:
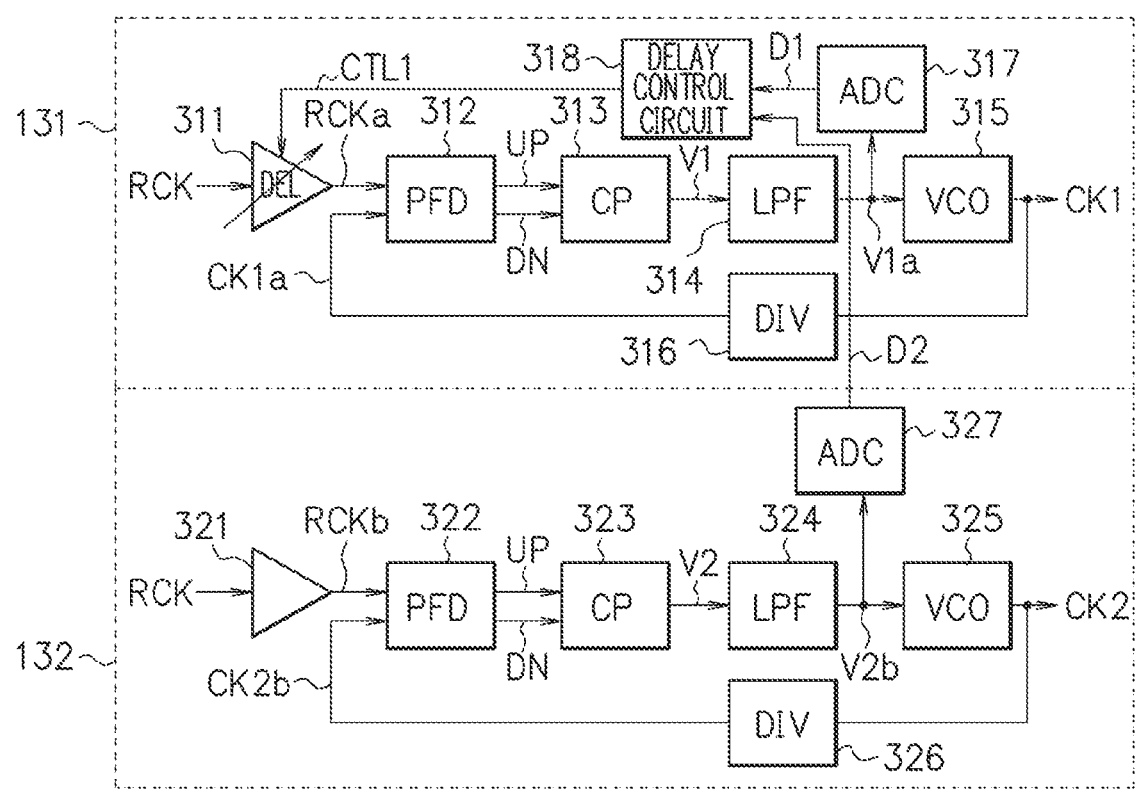
FIG. 5 is a diagram illustrating a configuration example of phase locked loop circuits according to a second embodiment.

FIG. 5 is a diagram illustrating a configuration example of phase locked loop circuits 131 and 132 according to a second embodiment. There will be explained differences of this embodiment from the first embodiment below. The phase locked loop circuit 131 in FIG. 5 has the same configuration as the phase locked loop circuit 131 in FIG. 3. The phase locked loop circuit 132 in FIG. 5 is that an analog-digital converter 327 is added to the phase locked loop circuit 132 in FIG. 3.

The analog-digital converter 327 converts the clock control signal V2b output from the low-pass filter 324 into a digital clock control signal from an analog clock control signal and outputs a digital control signal D2 to the delay control circuit 318. The delay control circuit 318 varies the delay amount of the delay circuit 311 from the minimum value to the maximum value and searches for the delay amount of the delay circuit 311 at which the total sum of the variation amount of the control signal D1 and the variation amount of the control signal D2 is minimum. Then, the delay control circuit 318 adjusts the delay amount of the delay circuit 311 to the delay amount at which the total sum of the variation amount of the control signal D1 and the variation amount of the control signal D2 is minimum. A concrete adjustment method is the same as that in the flowchart in FIG. 4. Thereby, it is possible to reduce the jitter in the output clock signal CK1 generated by the phase locked loop circuit 131 and the jitter in the output clock signal CK2 generated by the phase locked loop circuit 132.

This embodiment can be applied to three or more phase locked loop circuits. In each of all the phase locked loop circuits 131 to 134, an analog-digital converter and a variable delay circuit are provided, and the delay control circuit 318 that is common to all the phase locked loop circuits 131 to 134 is provided. The delay control circuit 318 varies the delay amount of the delay circuit in each of the phase locked loop circuits 131 to 134 and adjusts the delay amounts of the delay circuits in all the phase locked loop circuits 131 to 134 so as to make the total sum of the variation amounts of the control signals D1, D2, and the like of all the phase locked loop circuits 131 to 134 minimum.

Incidentally, in the case where the variation amount of the control signal of any of the phase locked loop circuits is larger than a threshold value even though the total sum of the variation amounts of the control signals D1, D2, and the like of all the phase locked loop circuits 131 to 134 is minimum, the combination of the delay amounts may not be employed.

Third Embodiment

Figure 6:
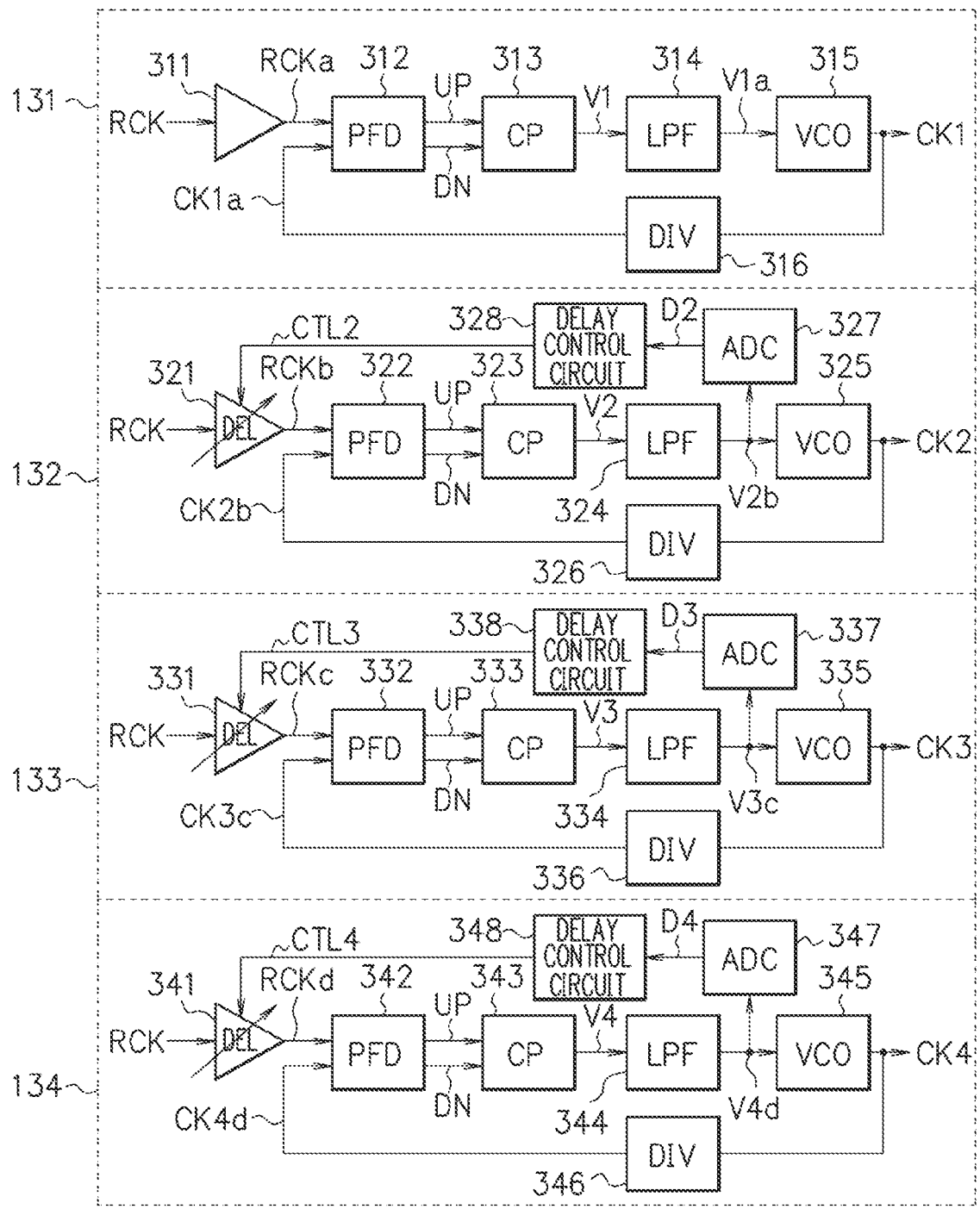
FIG. 6 is a diagram illustrating a configuration example of phase locked loop circuits according to a third embodiment.

FIG. 6 is a diagram illustrating a configuration example of phase locked loop circuits 131 to 134 according to a third embodiment. There will be explained differences of this embodiment from the first embodiment below. The phase locked loop circuit 131, the phase locked loop circuit 132, the phase locked loop circuit 133, and the phase locked loop circuit 134 are provided adjacently to one another in the order mentioned above. The phase locked loop circuit 132 is provided between the phase locked loop circuit 131 and the phase locked loop circuit 133. The phase locked loop circuit 133 is provided between the phase locked loop circuit 132 and the phase locked loop circuit 134.

The phase locked loop circuit 131 in FIG. 6 is that the analog-digital converter 317 and the delay control circuit 318 are deleted from the phase locked loop circuit 131 in FIG. 3. The delay circuit 311 delays the reference clock signal RCK by a predetermined delay amount and outputs the delayed reference clock signal RCKa to the phase frequency detector 312. Incidentally, the delay circuit 311 may be deleted.

The phase locked loop circuit 132 in FIG. 6 is that the analog-digital converter 327 and a delay control circuit 328 are added to the phase locked loop circuit 132 in FIG. 3. The delay circuit 321 is capable of adjusting a delay amount, delays the reference clock signal RCK by the delay amount, and outputs the delayed reference clock signal RCKb to the phase frequency detector 322. The analog-digital converter 327 converts the clock control signal V2b into a digital clock control signal from an analog clock control signal and outputs the digital control signal D2 to the delay control circuit 328. The delay control circuit 328 adjusts the delay amount of the delay circuit 321 by the delay control signal CTL2 so as to make the variation amount of the control signal D2 minimum. This makes the delay control circuit 328 possible to adjust the delay amount of the delay circuit 321 by the delay control signal CTL2 so as to make the jitter in the output clock signal CK2 minimum. The analog-digital converter 327 and the delay control circuit 328 are one example of a monitoring circuit, and monitor the jitter in the output clock signal CK2 and adjust the delay amount of the delay circuit 321 based on a result of monitoring the jitter in the output clock signal CK2.

The phase locked loop circuit 133 includes a delay circuit 331, a phase frequency detector 332, a charge pump 333, a low-pass filter 334, a voltage controlled oscillator 335, a frequency divider 336, an analog-digital converter 337, and a delay control circuit 338, and generates an output clock signal CK3.

The delay circuit 331 is capable of adjusting a delay amount, delays the reference clock signal RCK by the delay amount, and outputs a delayed reference clock signal RCKc. The frequency divider 336 divides the frequency of the output clock signal CK3 generated by the voltage controlled oscillator 335 and outputs a frequency-divided clock signal CK3c to the phase frequency detector 332. The phase frequency detector 332 compares phases and frequencies of the delayed reference clock signal RCKc and the clock signal CK3c and outputs an up signal UP or a down signal DN to the charge pump 333 based on a result of the comparison. When receiving the up signal UP, the charge pump 333 increases the voltage of a control signal V3, and when receiving the down signal DN, the charge pump 333 lowers the voltage of the control signal V3. The low-pass filter 334 low-pass filters the control signal V3 and outputs a low-pass filtered clock control signal V3c to the voltage controlled oscillator 335. The phase frequency detector 332, the charge pump 333, the low-pass filter 334, and the frequency divider 336 are one example of a clock control circuit that generates the clock control signal V3c. The voltage controlled oscillator 335 is a clock signal generation circuit and generates the output clock signal CK3 of a frequency based on a voltage of the clock control signal V3c. The analog-digital converter 337 converts the clock control signal V3c into a digital clock control signal from an analog clock control signal and outputs the digital control signal D3 to the delay control circuit 338. The delay control circuit 338 adjusts the delay amount of the delay circuit 331 by a delay control signal CTL3 so as to make the variation amount of the control signal D3 minimum. This makes the delay control circuit 338 possible to adjust the delay amount of the delay circuit 331 by the delay control signal CTL3 so as to make the jitter in the output clock signal CK3 minimum. The analog-digital converter 337 and the delay control circuit 338 are one example of a monitoring circuit, and monitor the jitter in the output clock signal CK3 and adjust the delay amount of the delay circuit 331 based on a result of monitoring the jitter in the output clock signal CK3.

The phase locked loop circuit 134 includes a delay circuit 341, a phase frequency detector 342, a charge pump 343, a low-pass filter 344, a voltage controlled oscillator 345, a frequency divider 346, an analog-digital converter 347, and a delay control circuit 348, and generates an output clock signal CK4.

The delay circuit 341 is capable of adjusting a delay amount, delays the reference clock signal RCK by the delay amount, and outputs a delayed reference clock signal RCKd. The frequency divider 346 divides the frequency of the output clock signal CK4 generated by the voltage controlled oscillator 345 and outputs a frequency-divided clock signal CK4d to the phase frequency detector 342. The phase frequency detector 342 compares phases and frequencies of the delayed reference clock signal RCKd and the clock signal CK4d and outputs an up signal UP or a down signal DN to the charge pump 343 based on a result of the comparison. When receiving the up signal UP, the charge pump 343 increases the voltage of a control signal V4, and when receiving the down signal DN, the charge pump 343 lowers the voltage of the control signal V4. The low-pass filter 344 low-pass filters the control signal V4 and outputs a low-pass filtered clock control signal V4d to the voltage controlled oscillator 345. The phase frequency detector 342, the charge pump 343, the low-pass filter 344, and the frequency divider 346 are one example of a clock control circuit that generates the clock control signal V4d. The voltage controlled oscillator 345 is a clock signal generation circuit and generates the output clock signal CK4 of a frequency based on a voltage of the clock control signal V4d. The analog-digital converter 347 converts the clock control signal V4d into a digital clock control signal from an analog clock control signal and outputs the digital control signal D4 to the delay control circuit 348. The delay control circuit 348 adjusts the delay amount of the delay circuit 341 by a delay control signal CTL4 so as to make the variation amount of the control signal D4 minimum. This makes the delay control circuit 348 possible to adjust the delay amount of the delay circuit 341 by the delay control signal CTL4 so as to make the jitter in the output clock signal CK4 minimum. The analog-digital converter 347 and the delay control circuit 348 are one example of a monitoring circuit, and monitor the jitter in the output clock signal CK4 and adjust the delay amount of the delay circuit 341 based on a result of monitoring the jitter in the output clock signal CK4.

Figure 7:
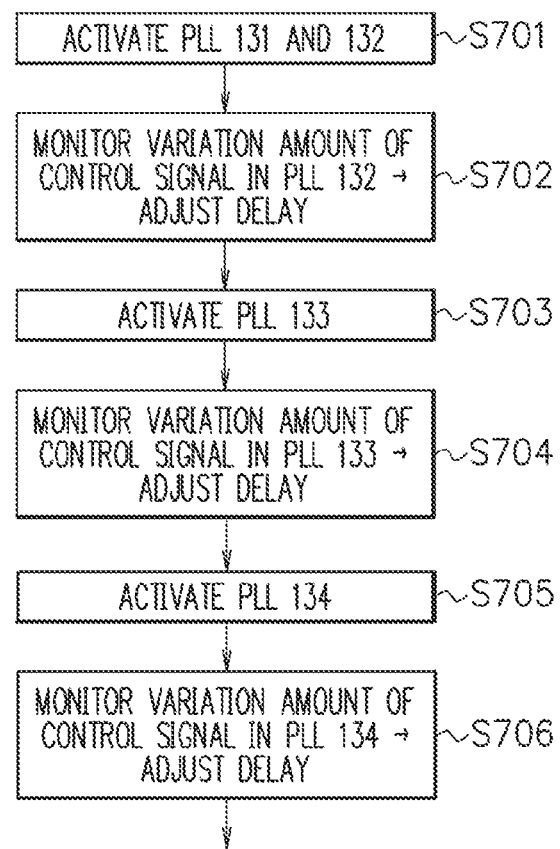
FIG. 7 is a flowchart illustrating a method of controlling the integrated circuit.

FIG. 7 is a flowchart illustrating a method of controlling the integrated circuit 100 according to this embodiment. Among the phase locked loop circuits 131 to 134, the phase locked loop circuits that are close in distance therebetween have large power supply noise interference and the phase locked loop circuits that are far in distance therebetween have small power supply noise interference. Thus, in this embodiment, among the phase locked loop circuits 131 to 134, the adjustment of the delay amount intended for minimizing the jitter is performed sequentially between the respective adjacent phase locked loop circuits, and thereby the power supply noise interference among all the phase locked loop circuits is suppressed. This makes it possible to reduce the jitter in the output clock signals CK1 to CK4 in all the phase locked loop circuits 131 to 134.

At Step S701, the central processing unit 101 controls the phase locked loop circuits 131 and 132 to bring them into an operation state and controls the other phase locked loop circuits 133, 134, and the like to bring them into an inoperative state.

Then, at Step S702, the delay control circuit 328 monitors the variation amount of the control signal D2 and adjusts the delay amount of the delay circuit 321 so as to make the variation amount of the control signal D2 minimum in the same manner as in the flowchart in FIG. 4. This makes it possible to suppress the power supply noise interference between the adjacent phase locked loop circuits 131 and 132 and reduce the jitter in the output clock signals CK1 and CK2.

Then, at Step S703, the central processing unit 101 controls the phase locked loop circuits 131 to 133 to bring them into an operation state and controls the other phase locked loop circuits 134, and the like to bring them into an inoperative state.

Then, at Step S704, the delay control circuit 338 monitors the variation amount of the control signal D3 and adjusts the delay amount of the delay circuit 331 so as to make the variation amount of the control signal D3 minimum in the same manner as in the flowchart in FIG. 4. This makes it possible to suppress the power supply noise interference among the adjacent phase locked loop circuits 131 to 133 and reduce the jitter in the output clock signals CK1 to CK3.

Then, at Step S705, the central processing unit 101 controls the phase locked loop circuits 131 to 134 to bring them into an operation state and controls the other phase locked loop circuits to bring them into an inoperative state.

Then, at Step S706, the delay control circuit 348 monitors the variation amount of the control signal D4 and adjusts the delay amount of the delay circuit 341 so as to make the variation amount of the control signal D4 minimum in the same manner as in the flowchart in FIG. 4. This makes it possible to suppress the power supply noise interference among the adjacent phase locked loop circuits 131 to 134 and reduce the jitter in the output clock signals CK1 to CK4.

Thereafter, in all the phase locked loop circuits, the same processing is performed. This makes it possible to reduce the jitter in the output clock signals in all the phase locked loop circuits.

Fourth Embodiment

Figure 8:
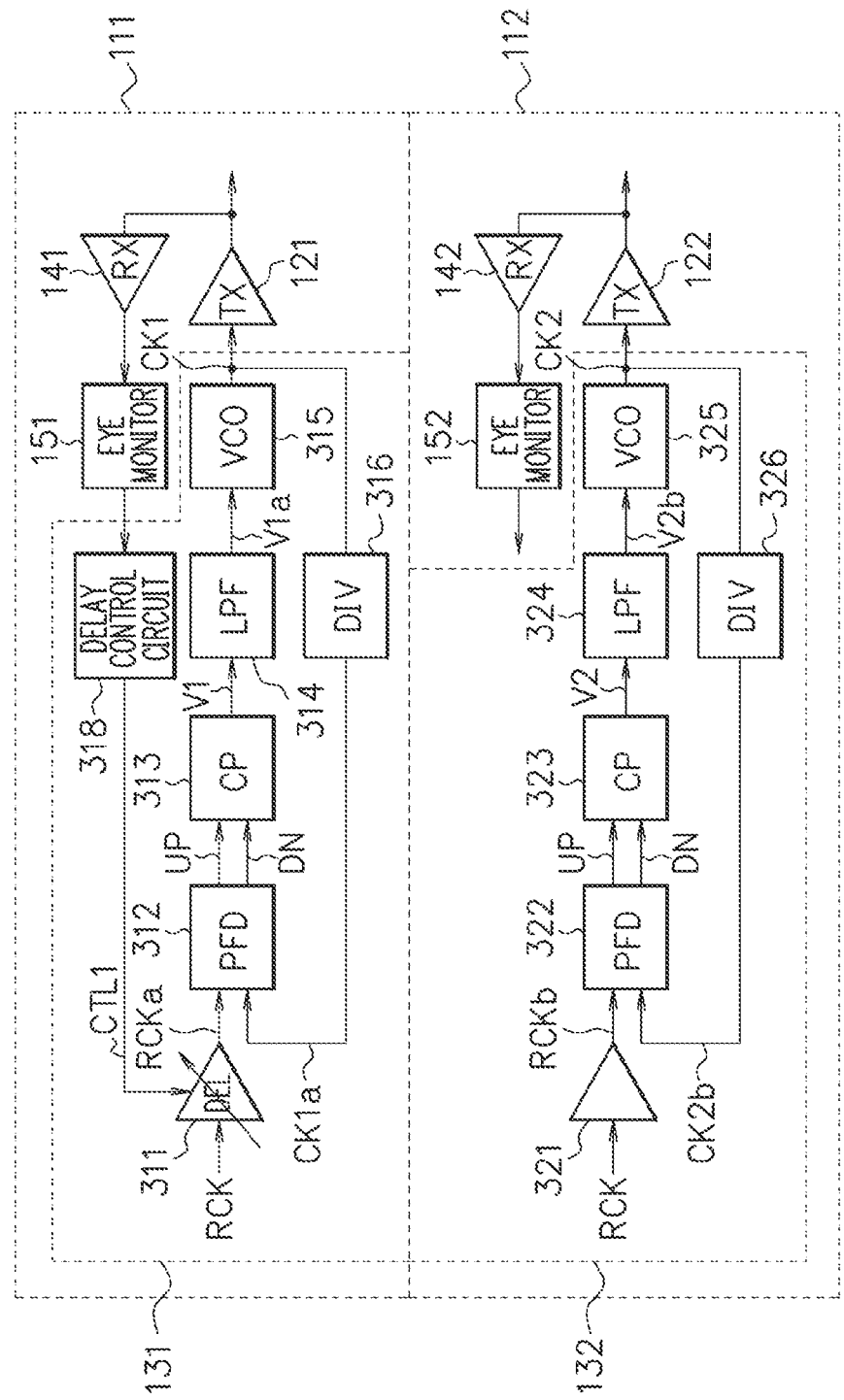
FIG. 8 is a diagram illustrating a configuration example of transmission and reception circuits according to a fourth embodiment.

FIG. 8 is a diagram illustrating a configuration example of transmission and reception circuits 111 and 112 according to a fourth embodiment. There will be explained differences of this embodiment from the first embodiment below.

Figure 9:
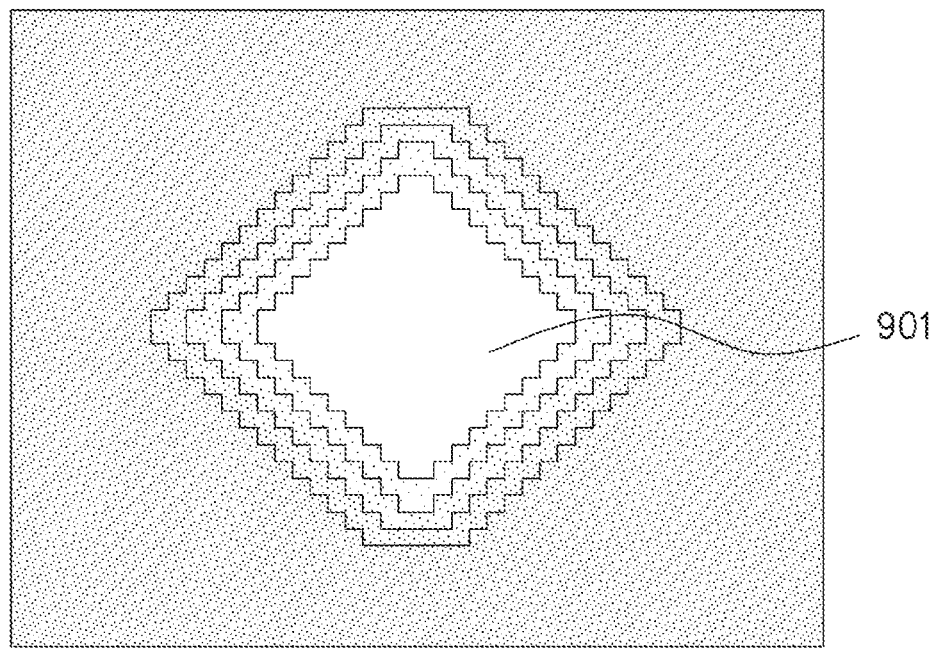
FIG. 9 is a view illustrating an eye pattern before adjusting a delay amount of a delay circuit.
Figure 10:
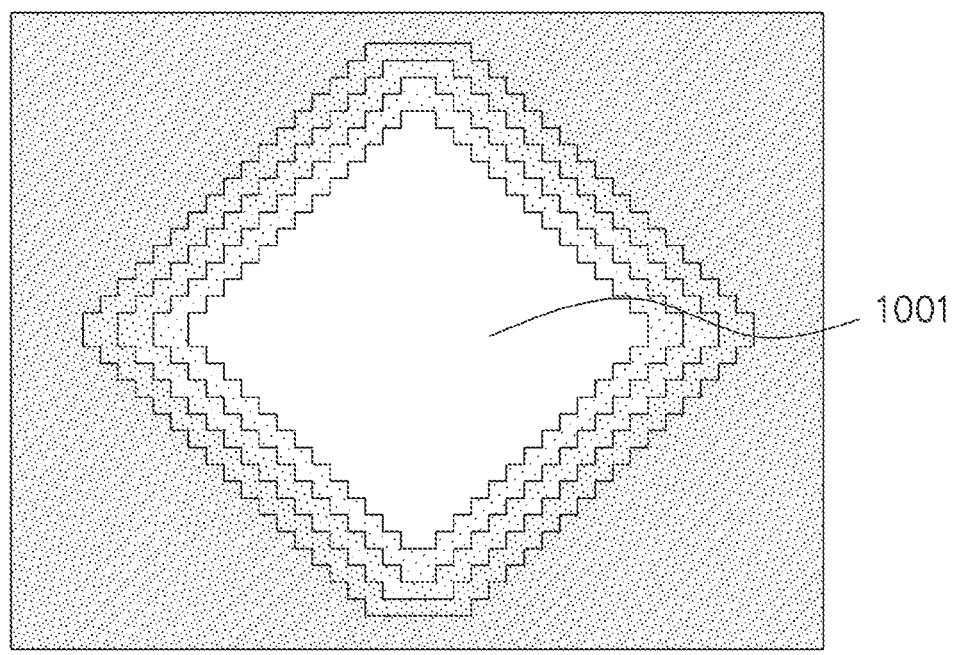
FIG. 10 is a view illustrating an eye pattern after adjusting the delay amount of the delay circuit.

The transmission and reception circuit 111 includes a transmission circuit 121, a phase locked loop circuit 131, a reception circuit 141, and an eye monitor 151. The phase locked loop circuit 131 in FIG. 8 is that the analog-digital converter 317 is deleted from the phase locked loop circuit 131 in FIG. 3. The transmission circuit 121 transmits test pattern data generated by a pattern generator in synchronization with the output clock signal CK1 generated by the phase locked loop circuit 131. An input terminal of the reception circuit 141 is switchable. At a normal mode in FIG. 1, the input terminal of the reception circuit 141 is connected to a different integrated circuit, and the reception circuit 141 receives data transmitted from the mentioned different integrated circuit. At an adjustment mode in FIG. 8, the input terminal of the reception circuit 141 is connected to an output terminal of the transmission circuit 121, and the reception circuit 141 receives data transmitted from the transmission circuit 121. The eye monitor 151 detects openings 901 and 1001 of eye patterns of the data received by the reception circuit 141 as illustrated in FIG. 9 and FIG. 10. The eye pattern is a pattern formed by superimposing a plurality of data transition patterns on a time axis. The delay control circuit 318 adjusts the delay amount of the delay circuit 311 so as to make the jitter in the output clock signal CK1 minimum based on the openings 901 and 1001 of the eye patterns detected by the eye monitor 151.

The transmission and reception circuit 112 includes a transmission circuit 122, a phase locked loop circuit 132, a reception circuit 142, and an eye monitor 152. The phase locked loop circuit 132 in FIG. 8 has the same configuration as the phase locked loop circuit 132 in FIG. 3. The transmission circuit 122 transmits test pattern data generated by a pattern generator in synchronization with the output clock signal CK2 generated by the phase locked loop circuit 132. An input terminal of the reception circuit 142 is switchable. At the normal mode in FIG. 1, the input terminal of the reception circuit 142 is connected to a different integrated circuit, and the reception circuit 142 receives data transmitted from the mentioned different integrated circuit. At the adjustment mode in FIG. 8, the input terminal of the reception circuit 142 is connected to an output terminal of the transmission circuit 122, and the reception circuit 142 receives data transmitted from the transmission circuit 122. The eye monitor 152 detects openings of eye patterns of the data received by the reception circuit 142.

Incidentally, the control of the delay amount of the delay circuit 321 is not performed, and thus the transmission circuit 122 does not need to transmit the test pattern data. The input terminal of the reception circuit 142 does not need to be connected to the output terminal of the transmission circuit 122. The eye monitor 152 may be deleted.

FIG. 9 is a view illustrating an eye pattern before adjusting the delay amount of the delay circuit 311. The eye monitor 151 detects the opening 901 of the eye pattern. In the case where the delay amount of the delay circuit 311 is inappropriate, the jitter in the output clock signal CK1 increases and the opening 901 of the eye pattern decreases in size.

FIG. 10 is a view illustrating an eye pattern after adjusting the delay amount of the delay circuit 311. The eye monitor 151 detects the opening 1001 of the eye pattern. In the case where the delay amount of the delay circuit 311 is appropriate, the jitter in the output clock signal CK1 is reduced and the opening 1001 of the eye pattern increases in size.

The delay control circuit 318 adjusts the delay amount of the delay circuit 311 so as to make the area of the opening of the eye pattern maximum. That is, the delay control circuit 318 adjusts the delay amount of the delay circuit 311 based on the opening of the eye pattern of a transmission signal generated based on the output clock signal CK1.

For example, the eye monitor 151 samples the output signal from the reception circuit 141 by a main sampler and a monitor sampler and compares obtained results with a threshold value, thereby performing binary determination. On this occasion, the eye monitor 151 compares a value determined by using the main sampler and a value determined by using the monitor sampler while changing a sampling phase of the monitor sampler and varying the threshold value, thereby detecting the opening of the eye pattern. The delay control circuit 318 searches for the delay amount of the delay circuit 311 at which the area of the opening of the eye pattern is maximum. Then, the delay control circuit 318 adjusts the delay amount of the delay circuit 311 so as to make the area of the opening of the eye pattern maximum. Thereby, it is possible to reduce the jitter in the output clock signals CK1 and CK2.

Incidentally, from the viewpoint of jitter, the delay control circuit 318 may adjust the delay amount of the delay circuit 311 so as to make the area of the opening in the center of the eye pattern in the direction of the time axis maximum.

Further, in place of the above-described reception circuit 141 and eye monitor 151, a reception circuit and an eye monitor in a different integrated circuit may be used. In this case, the transmission circuit 121 transmits the test pattern data to the mentioned different integrated circuit in synchronization with the output clock signal CK1. In the mentioned different integrated circuit, the reception circuit receives the test pattern data and the eye monitor 151 detects an opening of an eye pattern of the test pattern data. The delay control circuit 318 adjusts the delay amount of the delay circuit 311 so as to make the area of the opening of the eye pattern detected by the eye monitor in the mentioned different integrated circuit maximum.

Further, the phase locked loop circuits 131, 132 according to the fourth embodiment that are illustrated in FIG. 8 can be modified as follows.

Similarly to the phase locked loop circuits 131, 132 according to the second embodiment that are illustrated in FIG. 5, for example, the delay control circuit 318 may adjust the delay amount of the delay circuit 311 based on the opening of the eye pattern detected by the eye monitor 152 in addition to the opening of the eye pattern detected by the eye monitor 151 so as to make the total sum of the areas of the openings of the two eye patterns detected by the eye monitors 151 and 152 maximum.

Further, similarly to the phase locked loop circuits 131 to 134 according to the third embodiment that are illustrated in FIG. 6, in addition to the phase locked loop circuits 131, 132 in FIG. 8, the circuits that are the same as the phase locked loop circuit 131 may be provided to be adjacent to each other and the adjustment of the delay amount intended for minimizing the jitter may be performed sequentially between the adjacent phase locked loop circuits.

Incidentally, the above-described embodiments merely illustrate one concrete example of implementing the present invention, and the technical scope of the present invention is not to be construed in a restrictive manner by the embodiment. That is, the present invention may be implemented in various forms without departing from the technical spirit or main features thereof.

According to one aspect, it is possible to reduce the jitter in an output clock signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase synchronization circuit, comprising:
    a first delay circuit for adjusting a first delay amount, the first delay circuit being configured to delay a first reference clock signal by the first delay amount, and output a first delayed reference clock signal;
    a first clock control circuit that is configured to compare phases of the first delayed reference clock signal and a first output clock signal and output a first clock control signal based on a result of the comparison;
    a first clock signal generation circuit that is configured to receive the first clock control signal and generate the first output clock signal based on the received first clock control signal; and
    a first monitoring circuit that is configured to monitor jitter in the first output clock signal and adjust the first delay amount based on a result of monitoring the jitter in the first output clock signal,
    wherein the first clock signal generation circuit includes a voltage controlled oscillator circuit configured to receive the first clock control signal as an input signal, and
    wherein the first monitoring circuit is configured to detect a variation amount of the input signal of the voltage controlled oscillator circuit and adjust the first delay amount based on the detected variation amount.

2. The phase synchronization circuit according to claim 1, further comprising:
    a second clock control circuit that is configured to compare phases of a second reference clock signal and a second output clock signal and generate a second clock control signal based on a result of the comparison; and
    a second clock signal generation circuit that is configured to generate the second output clock signal based on the second clock control signal, wherein
    the first monitoring circuit is configured to adjust the first delay amount based on variation of the first clock control signal and variation of the second clock control signal.

3. The phase synchronization circuit according to claim 1, further comprising:
    a second clock control circuit that is configured to compare phases of a second reference clock signal and a second output clock signal and generate a second clock control signal based on a result of the comparison;
    a second clock signal generation circuit that is configured to generate the second output clock signal based on the second clock control signal;
    a second delay circuit for adjusting a second delay amount, the second delay circuit being configured to delay a third reference clock signal by the second delay amount, and output a second delayed reference clock signal;

a third clock control circuit that is configured to compare phases of the second delayed reference clock signal and a third output clock signal and generate a third clock control signal based on a result of the comparison;

a third clock signal generation circuit that is configured to generate the third output clock signal based on the third clock control signal; and a second monitoring circuit that is configured to monitor jitter in the third output clock signal and adjust the second delay amount based on a result of monitoring the jitter in the third output clock signal.

4. The phase synchronization circuit according to claim 3, wherein a combination of the first clock control circuit and the first clock signal generation circuit is provided between a combination of the second clock control circuit and the second clock signal generation circuit and a combination of the third clock control circuit and the third clock signal generation circuit, the first monitoring circuit is configured to adjust the first delay amount based on variation of the first clock control signal in a state where the combination of the first clock control circuit and the first clock signal generation circuit and the combination of the second clock control circuit and the second clock signal generation circuit are in operation and the combination of the third clock control circuit and the third clock signal generation circuit is not in operation, and the second monitoring circuit is configured to adjust the second delay amount based on variation of the third clock control signal in a state where the combination of the first clock control circuit and the first clock signal generation circuit, the combination of the second clock control circuit and the second clock signal generation circuit, and the combination of the third clock control circuit and the third clock signal generation circuit are in operation after the adjusting of the first monitoring circuit.

5. A transmission and reception circuit, comprising:

a first phase synchronization circuit that is configured to generate a first output clock signal;

a first transmission circuit that is configured to perform data transmission based on the first output clock signal; and a first reception circuit that is configured to perform data reception based on the first output clock signal, wherein the first phase synchronization circuit comprises:
  a first delay circuit for adjusting a first delay amount, the first delay circuit being configured to delay a first reference clock signal by the first delay amount, and outputs a first delayed reference clock signal;
  a first clock control circuit that is configured to compare phases of the first delayed reference clock signal and the first output clock signal and output a first clock control signal based on a result of the comparison;
  a first clock signal generation circuit that is configured to receive the first clock control signal and generate the first output clock signal based on the received first clock control signal; and
  a first monitoring circuit that is configured to monitor jitter in the first output clock signal and adjust the first delay amount based on a result of monitoring the jitter in the first output clock signal,
  wherein the first clock signal generation circuit includes a voltage controlled oscillator circuit configured to receive the first clock control signal as an input signal, and
  wherein the first monitoring circuit is configured to detect a variation amount of the input signal of the voltage controlled oscillator circuit and adjust the first delay amount based on the detected variation amount.

6. The transmission and reception circuit according to claim 5, further comprising:

a second phase synchronization circuit that is configured to generate a second output clock signal;

a second transmission circuit that is configured to perform data transmission based on the second output clock signal; and a second reception circuit that is configured to perform data reception based on the second output clock signal, wherein the second phase synchronization circuit comprises:
  a second clock control circuit that is configured to compare phases of a second reference clock signal and the second output clock signal and generate a second clock control signal based on a result of the comparison; and
  a second clock signal generation circuit that is configured to generate the second output clock signal based on the second clock control signal, and
  the first monitoring circuit is configured to adjust the first delay amount based on variation of the first clock control signal and variation of the second clock control signal.

7. The transmission and reception circuit according to claim 5, further comprising:

a second phase synchronization circuit that is configured to generate a second output clock signal;

a second transmission circuit that is configured to perform data transmission based on the second output clock signal;

a second reception circuit that is configured to perform data reception based on the second output clock signal;

a third phase synchronization circuit that is configured to generate a third output clock signal;

a third transmission circuit that is configured to perform data transmission based on the third output clock signal; and a third reception circuit that is configured to perform data reception based on the third output clock signal, wherein the second phase synchronization circuit comprises:
  a second clock control circuit that is configured to compare phases of a second reference clock signal and the second output clock signal and generate a second clock control signal based on a result of the comparison; and
  a second clock signal generation circuit that is configured to generate the second output clock signal based on the second clock control signal, the third phase synchronization circuit comprises:
  a second delay circuit for adjusting a second delay amount, the second delay circuit being configured to delay a third reference clock signal by the second delay amount, and output a second delayed reference clock signal;
  a third clock control circuit that is configured to compare phases of the second delayed reference clock signal and the third output clock signal and generate a third clock control signal based on a result of the comparison;

a third clock signal generation circuit that is configured to generate the third output clock signal based on the third clock control signal; and a second monitoring circuit that is configured to monitor jitter in the third output clock signal and adjust the second delay amount based on a result of monitoring the jitter in the third output clock signal.

8. The transmission and reception circuit according to claim 7, wherein the first phase synchronization circuit is provided between the second phase synchronization circuit and the third phase synchronization circuit, the first monitoring circuit is configured to adjust the first delay amount based on variation of the first clock control signal in a state where the first phase synchronization circuit and the second phase synchronization circuit are in operation and the third phase synchronization circuit is not in operation, and the second monitoring circuit is configured to adjust the second delay amount based on variation of the third clock control signal in a state where the first phase synchronization circuit, the second phase synchronization circuit, and the third phase synchronization circuit are in operation after the adjusting of the first monitoring circuit.

9. An integrated circuit, comprising:

a first phase synchronization circuit that is configured to generate a first output clock signal;

a first transmission circuit that is configured to transmit first transmission data based on the first output clock signal;

first output clock signal;

a first reception circuit that is configured to receive first reception data based on the first output clock signal; and an internal circuit that is configured to output the first transmission data to the first transmission circuit and receive the first reception data from the first reception circuit, wherein the first phase synchronization circuit comprises:

a first delay circuit for adjusting a first delay amount, the first delay circuit being configured to delay a first reference clock signal by the first delay amount, and output a first delayed reference clock signal;

a first clock control circuit that is configured to compare phases of the first delayed reference clock signal and the first output clock signal and output a first clock control signal based on a result of the comparison;

a first clock signal generation circuit that is configured to receive the first clock control signal and generate the first output clock signal based on the received first clock control signal; and a first monitoring circuit that is configured to monitor jitter in the first output clock signal and adjust the first delay amount based on a result of monitoring the jitter in the first output clock signal, wherein the first clock signal generation circuit includes a voltage controlled oscillator circuit configured to receive the first clock control signal as an input signal, and wherein the first monitoring circuit is configured to detect a variation amount of the input signal of the voltage controlled oscillator circuit and adjust the first delay amount based on the detected variation amount.

10. The integrated circuit according to claim 9, further comprising:

a second phase synchronization circuit that is configured to generate a second output clock signal;

a second transmission circuit that is configured to transmit second transmission data based on the second output clock signal; and a second reception circuit that is configured to receive second reception data based on the second output clock signal, wherein the second phase synchronization circuit comprises:

a second clock control circuit that is configured to compare phases of a second reference clock signal and the second output clock signal and generate a second clock control signal based on a result of the comparison; and a second clock signal generation circuit that is configured to generate the second output clock signal based on the second clock control signal, and the first monitoring circuit is configured to adjust the first delay amount based on variation of the first clock control signal and variation of the second clock control signal.

11. The integrated circuit according to claim 9, further comprising:

a second phase synchronization circuit that is configured to generate a second output clock signal;

a second transmission circuit that is configured to transmit second transmission data based on the second output clock signal;

a second reception circuit that is configured to receive second reception data based on the second output clock signal;

a third phase synchronization circuit that is configured to generate a third output clock signal;

a third transmission circuit that is configured to transmit third transmission data based on the third output clock signal; and a third reception circuit that is configured to receive third reception data based on the third output clock signal, wherein the second phase synchronization circuit comprises:

a second clock control circuit that is configured to compare phases of a second reference clock signal and the second output clock signal and generate a second clock control signal based on a result of the comparison; and a second clock signal generation circuit that is configured to generate the second output clock signal based on the second clock control signal, the third phase synchronization circuit comprises:

a second delay circuit for adjusting a second delay amount, the second delay circuit being configured to delay a third reference clock signal by the second delay amount, and output a second delayed reference clock signal;

a third clock control circuit that is configured to compare phases of the second delayed reference clock signal and the third output clock signal and generate a third clock control signal based on a result of the comparison;

a third clock signal generation circuit that is configured to generate the third output clock signal based on the third clock control signal; and a second monitoring circuit that is configured to monitor jitter in the third output clock signal and adjust the second delay amount based on a result of monitoring the jitter in the third output clock signal.

12. The integrated circuit according to claim 11, wherein
the first phase synchronization circuit is provided between the second phase synchronization circuit and the third phase synchronization circuit,
the first monitoring circuit is configured to adjust the first delay amount based on variation of the first clock control signal in a state where the first phase synchronization circuit and the second phase synchronization circuit are in operation and the third phase synchronization circuit is not in operation, and
the second monitoring circuit is configured to adjust the second delay amount based on variation of the third clock control signal in a state where the first phase synchronization circuit, the second phase synchronization circuit, and the third phase synchronization circuit are in operation after the adjusting of the first monitoring circuit.

13. A phase synchronization circuit, comprising:
a first delay circuit for adjusting a first delay amount, the first delay circuit being configured to delay a first reference clock signal by the first delay amount, and output a first delayed reference clock signal;
a first clock control circuit that is configured to compare phases of the first delayed reference clock signal and a first output clock signal and generate a first clock control signal based on a result of the comparison;
a first clock signal generation circuit that is configured to generate the first output clock signal based on the first clock control signal; and
a first monitoring circuit that is configured to monitor jitter in the first output clock signal and adjust the first delay amount based on a result of monitoring the jitter in the first output clock signal,
wherein the first monitoring circuit is configured to adjust the first delay amount based on an area of an opening an eye pattern of a transmission signal generated based on the first output clock signal, and
the first monitoring circuit is configured to adjust the first delay amount so as to make the area of the opening of the eye pattern maximum.

14. A transmission and reception circuit, comprising:
a first phase synchronization circuit that is configured to generate a first output clock signal;
a first transmission circuit that is configured to perform data transmission based on the first output clock signal; and
a first reception circuit that is configured to perform data reception based on the first output clock signal, wherein
the first phase synchronization circuit comprises:
a first delay circuit for adjusting a first delay amount, the first delay circuit being configured to delay a first reference clock signal by the first delay amount, and outputs a first delayed reference clock signal;
a first clock control circuit that is configured to compare phases of the first delayed reference clock signal and the first output clock signal and generate a first clock control signal based on a result of the comparison;
a first clock signal generation circuit that is configured to generate the first output clock signal based on the first clock control signal; and
a first monitoring circuit that is configured to monitor jitter in the first output clock signal and adjust the first delay amount based on a result of monitoring the jitter in the first output clock signal,
wherein the first monitoring circuit is configured to adjust the first delay amount based on an area of an opening of an eye pattern of a transmission signal generated based on the first output clock signal by the first transmission circuit, and
the first monitoring circuit is configured to adjust the first delay amount so as to make the area of the opening of the eye pattern maximum.

15. An integrated circuit, comprising:
a first phase synchronization circuit that is configured to generate a first output clock signal;
a first transmission circuit that is configured to transmit first transmission data based on the first output clock signal;
a first reception circuit that is configured to receive first reception data based on the first output clock signal; and
an internal circuit that is configured to output the first transmission data to the first transmission circuit and receive the first reception data from the first reception circuit, wherein
the first phase synchronization circuit comprises:
a first delay circuit for adjusting a first delay amount, the first delay circuit being configured to delay a first reference clock signal by the first delay amount, and output a first delayed reference clock signal;
a first clock control circuit that is configured to compare phases of the first delayed reference clock signal and the first output clock signal and generate a first clock control signal based on a result of the comparison;
a first clock signal generation circuit that is configured to generate the first output clock signal based on the first clock control signal; and
a first monitoring circuit that is configured to monitor jitter in the first output clock signal and adjust the first delay amount based on a result of monitoring the jitter in the first output clock signal,
wherein the first monitoring circuit is configured to adjust the first delay amount based on an area of an opening of an eye pattern of a transmission signal generated based on the first output clock signal by the first transmission circuit, and
the first monitoring circuit is configured to adjust the first delay amount so as to make the area of the opening of the eye pattern maximum.

* * * * *